(12) United States Patent
Liu et al.

(10) Patent No.: US 9,029,179 B2
(45) Date of Patent: May 12, 2015

(54) MEMS DEVICE WITH IMPROVED CHARGE ELIMINATION AND METHODS OF PRODUCING SAME

(75) Inventors: Fang Liu, Woburn, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 223 days.

(21) Appl. No.: 13/535,781

(22) Filed: Jun. 28, 2012

(65) Prior Publication Data
US 2014/0001577 A1 Jan. 2, 2014

(51) Int. Cl.
*H01L 21/02* (2006.01)
*B81B 3/00* (2006.01)

(52) U.S. Cl.
CPC .................. *B81B 3/0008* (2013.01)

(58) Field of Classification Search
CPC .............. H01L 2924/1461; B81B 3/0005; B81B 3/0008
USPC .................... 257/53, 415; 428/408
See application file for complete search history.

(56) References Cited

U.S. PATENT DOCUMENTS

| | | | |
|---|---|---|---|
| 5,429,708 A | 7/1995 | Linford et al. | 216/66 |
| 5,597,767 A | 1/1997 | Mignardi et al. | 437/227 |
| 5,662,771 A | 9/1997 | Stouppe | 438/52 |
| 5,694,740 A | 12/1997 | Martin et al. | 53/431 |
| 5,939,633 A | 8/1999 | Judy | 73/514.32 |
| 6,505,511 B1 | 1/2003 | Geen et al. | 73/504.12 |
| 6,859,542 B2 | 2/2005 | Johannsen et al. | 381/174 |
| 6,869,815 B2 | 3/2005 | Gasparyan et al. | 438/29 |
| 6,953,977 B2 | 10/2005 | Mlcak et al. | 257/414 |
| 7,015,056 B2 | 3/2006 | Gasparyan et al. | 438/29 |
| 7,364,942 B2 | 4/2008 | Martin | 438/106 |
| 7,625,773 B2 | 12/2009 | Lutz et al. | 438/50 |
| 2004/0185284 A1 | 9/2004 | Ho et al. | 428/500 |
| 2007/0069759 A1 | 3/2007 | Rzepiela et al. | 324/765 |
| 2007/0109003 A1 | 5/2007 | Shi et al. | 324/755 |
| 2009/0132188 A1 | 5/2009 | Watanabe | 702/64 |

(Continued)

FOREIGN PATENT DOCUMENTS

CN 1167342 A 12/1997
WO WO 2007/022538 A2 2/2007

OTHER PUBLICATIONS

Bhushan et al., "Wetting study of patterned surfaces for superhydrophobicity," *Ultramicroscopy*, vol. 107, pp. 1033-1041 (2007).

(Continued)

*Primary Examiner* — Kenneth Parker
*Assistant Examiner* — Bo Fan
(74) *Attorney, Agent, or Firm* — Sunstein Kan Murphy & Timbers LLP

(57) ABSTRACT

A method for producing a MEMS device having improved charge elimination characteristics includes providing a substrate having one or more layers, and applying a first charge elimination layer onto at least one portion of one given layer of the substrate. The method may then (1) apply a sacrificial layer onto the first charge elimination layer, (2) apply a second charge elimination layer onto at least a portion of the sacrificial layer, and (3) deposit a movable layer onto at least a portion of the second charge elimination layer. To form a structure within the movable layer the method may etch the movable layer. The method may then etch the sacrificial layer to release the structure.

11 Claims, 7 Drawing Sheets

(56) References Cited

U.S. PATENT DOCUMENTS

| | | | |
|---|---|---|---|
| 2010/0127339 A1* | 5/2010 | Laermer et al. | 257/415 |
| 2011/0073859 A1* | 3/2011 | Chen et al. | 257/53 |
| 2012/0141800 A1* | 6/2012 | Steinmuller et al. | 428/408 |

OTHER PUBLICATIONS

Jiang et al., "Electrical charge trapping at defects on the Si (111) 7×7 surface," *Appl. Phys. Lett.*, vol. 88, No. 6, pp. 061909-1-061909-3 (2006).

ramé-hart, "Information on Contact Angle," 1961-2011 50th Anniversary, 4 pages (printed 2011) www.ramehart.com/contatangle.htm.

Sarro, "Silicon carbide as a new MEMS technology," *Sensors Actuat. A-Phys.*, vol. 82, Nos. 1-3, pp. 210-218 (May 2000).

Wang et al., "Stable superhydrophobic composite coatings made from an aqueous dispersion of carbon nanotubes and a fluoropolymer," *Carbon*, vol. 49, pp. 1769-1774 (2011).

Xiu et al., "Eutectic Liquid in Sol-Gel Process for Superhydrophobic Silica Thin Films—Antistiction of MEMS Devices," *IEEE Adv. Packaging Mat. Symp.*, 8 pages (2007).

\* cited by examiner

MEMS DEVICE WITH IMPROVED CHARGE ELIMINATION AND METHODS OF PRODUCING SAME

TECHNICAL FIELD

The present invention relates to MEMS devices, and more particularly to methods for improving the charge elimination characteristics of MEMS devices.

BACKGROUND ART

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, many such MEMS devices often have a structure suspended above a substrate, and associated circuitry that both senses movement of the suspended structure and delivers the sensed movement data to one or more external devices (e.g., an external computer). The external device processes the sensed data to calculate the property being measured (e.g., pitch angle or acceleration).

When a voltage is applied to a MEMS device, a surface charge may build up within the MEMS device (e.g., within a surface of the capacitor of the MEMS). This surface charge can impact the performance and accuracy of the MEMS device by redistributing the electric field. This redistribution of the electric field can cause the performance of the device to drift, and can severely restrict the range of stable operation of some MEMS devices. In more severe instances, the trapped surface charges can cause stiction and device failure.

SUMMARY OF THE EMBODIMENTS

A first embodiment of the invention involves a method for producing a MEMS device having improved charge elimination characteristics. The method may include providing a substrate (e.g., silicon) with one or more layers, and applying a first charge elimination layer onto at least a portion of one given layer of the substrate. The method may then apply a sacrificial layer onto the first charge elimination layer, apply a second charge elimination layer onto at least a portion of the sacrificial layer, and deposit a movable layer onto at least a portion of the second charge elimination layer. The second charge elimination material may cover a bottom surface of the structure. To form a structure within the movable layer, the method may etch the movable layer. The method may also etch the sacrificial layer to release the structure.

In some embodiments, the method may also apply a third charge elimination layer onto the movable layer. The method may then etch the second and third charge elimination layers to remove at least a portion of the second and third charge elimination layers. Additionally or alternatively, the method may deposit a photoresistance layer onto the third charge elimination layer (e.g., prior to etching the third charge elimination layer). The photoresistance layer may be resistant to etching and may allow selective etching of the third charge elimination layer, movable layer, and the second charge elimination layer to form the structure within the movable layer. The method may then remove the photoresistance layer.

Furthermore, the method may deposit a fourth charge elimination layer onto the MEMS device. The fourth charge elimination layer may cover a plurality of side surfaces of the structure and at least a portion of the sacrificial layer. The method may then etch the fourth charge elimination layer to remove at least a portion of the fourth charge elimination layer covering the sacrificial layer.

The first charge elimination layer may be a carbon related layer, and may include titanium carbide, silicon carbide, diamond-like-carbon, diamond, graphene, graphite, carbon nanotube clusters, and/or amorphous carbon. The structure may be a sensing structure and/or a diaphragm, and the substrate may form a backplate.

In accordance with additional embodiments, a MEMS device may include a substrate, a stationary structure supported by the substrate, and a first charge elimination layer (e.g., a carbon related layer). The stationary structure may have a first face, and the first charge elimination layer may be adjacent to the first face of the stationary structure. The first charge elimination layer may be configured to mitigate a build up of charge within the substrate.

The MEMS device may also have a movable structure with a second surface. The second surface of the movable structure may face the first charge elimination layer, and may have a second charge elimination layer. The second charge elimination material may be configured to mitigate a build up of surface charge within the movable structure. The second surface may be a bottom surface and/or a side surface of the movable structure.

In further embodiments, the top surface of the movable structure may have a third charge elimination layer, and at least one of the side surfaces of the sensing structure may be coated with a fourth charge elimination layer. The first charge elimination material may cover at least a portion of the substrate. The movable structure may be a sensing structure and/or a diaphragm and the stationary structure may form a backplate.

In accordance with additional embodiments, a method for producing a MEMS device having improved charge elimination characteristics may include providing a substrate having a first surface and one or more layers, applying a sacrificial layer onto the substrate, depositing a movable layer onto at least a portion of the sacrificial layer, and etching the movable layer to form a structure within the movable layer. The structure may have a second surface facing the first surface. The second surface of the structure may be spaced from at least a portion of the substrate. The method may also etch the sacrificial layer to release the structure, and introduce a charge elimination material in a vapor phase (e.g., a carbon related material) between the substrate and the structure. The charge elimination material may coat at least one of the first surface and the second surface.

In some embodiments, the second surface may be a side surface of the structure. Alternatively, the first surface may be a top surface of the substrate, and the second surface may be a bottom surface of the structure. The charge elimination material may also coat a top surface and/or a plurality of side surfaces of the sensing structure. The structure may be a sensing structure and/or a diaphragm and the substrate may form a backplate.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In illustrative embodiments, a MEMS device has improved charge elimination characteristics. More specifically, the MEMS device can have one or more layers of a charge elimination material that helps dissipate charge stored within the MEMS device and/or substantially prevent charge from building up. By dissipating the retained charges and/or substantially preventing charge from building up, MEMS devices (e.g., a MEMS accelerometer, gyroscope, etc.) formed in accordance with various embodiments of the present invention can have improved accuracy and reliability, and reduce performance drift. Details of illustrative embodiments are discussed in greater detail below.

MEMS devices such as MEMS accelerometers and gyroscopes often employ capacitors with multiple electrodes to measure a force applied to the MEMS device. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Figure 1A:
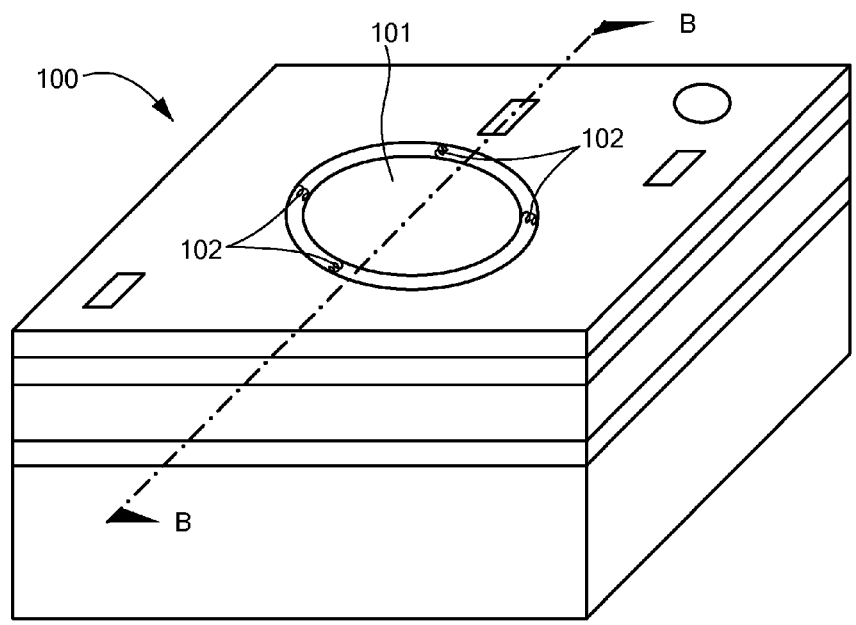
FIGS. 1A and 1B schematically shows a MEMS microphone.
Figure 1B:
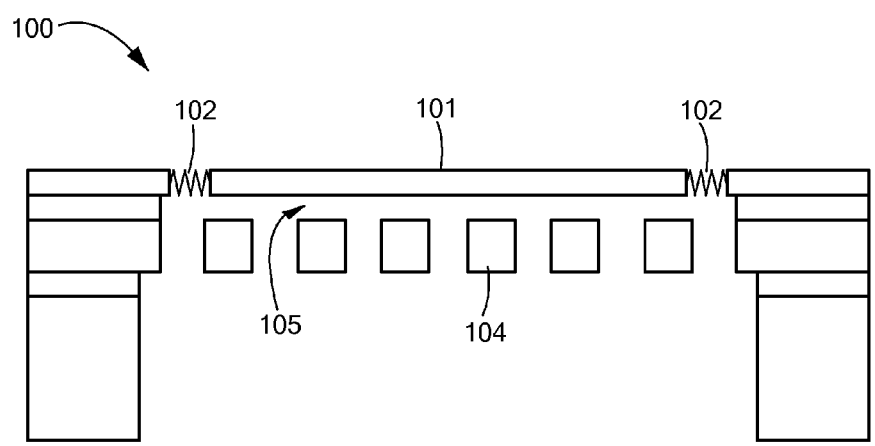

Illustrative embodiments also apply to other MEMS devices such as pressure sensors and microphones. For example, FIGS. 1A and 1B schematically illustrate a perspective view and a cross-sectional view, along line B-B of FIG. 1A, of a micromachined microphone 100 with a diaphragm 101 that may be susceptible to charge retention. As mentioned above, this charge retention can negatively impact the performance of the device. It should be noted that a microphone is discussed as an example only. As shown in FIGS. 1A and 1B, the diaphragm 101 is suspended by springs 102 above a backplate 104. Both the diaphragm 101 and backplate 104 are conductive, but are electrically isolated from each other. In this manner, the diaphragm 101 and backplate 104 form a variable capacitor.

In operation, the sound waves impinge on the diaphragm 101, causing the diaphragm 101 to vibrate. This vibration, in turn, changes the distance (e.g., gap 105) between the diaphragm 101 and backplate 104, causing a change in capacitance between the diaphragm 101 and backplate 104. For example, as the distance decreases (e.g., as the gap 105 narrows), the diaphragm 101 approaches the backplate 104 and the capacitance between the structures increases. Conversely, as the distance increases (e.g., as the gap 105 widens), the capacitance of the variable capacitor formed by the diaphragm 101 and backplate 104 decreases. The variable capacitance can be electronically processed to produce an electrical signal representing the impinging sound waves.

Figure 2A:
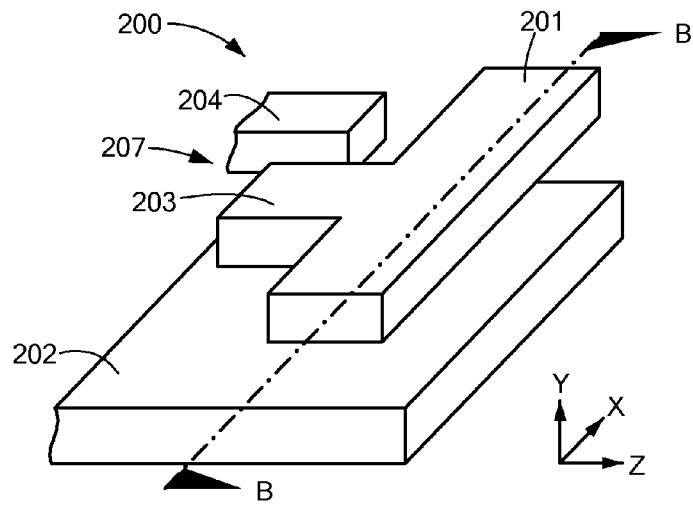
FIGS. 2A and 2B schematically shows a MEMS accelerometer.
Figure 2B:
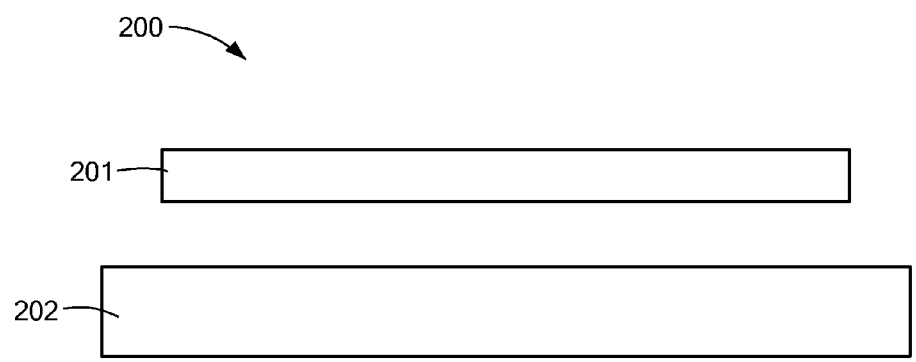

FIGS. 2A and 2B schematically illustrate a portion of a micromachined accelerometer 200 and a cross section of the accelerometer 200 along B-B, respectively. As shown in FIGS. 2A and 2B, the accelerometer 200 has a movable mass (or "beam") 201 that is suspended by springs (not shown) above a substrate 202. The beam 201, in turn, includes a finger 203 that forms a variable capacitor with a counterpart finger 204 on the substrate 202 (e.g., across a lateral gap 207). When the substrate 202 is subjected to an acceleration (e.g. in the +X direction), the inertia of the beam 201 causes a corresponding displacement of the beam 201 relative to the counterpart finger 224. The displacement of the beam 201 varies the capacitance of the variable capacitor. In a manner similar to that of the microphone 100 discussed above, the variable capacitance can be electronically processed to produce an electrical signal representing the acceleration.

In some circumstances, a surface charge may undesirably build up within the microphone 100 (e.g., within the surfaces of the diaphragm 101 and/or the backplate 105) and/or the accelerometer 200 (e.g., within the surfaces of the beam 201 and/or the substrate 202). As mentioned above, a built-up/retained surface charge can impact the performance and accuracy of the MEMS device by redistributing the electric field. For example, redistribution of the electric field can cause the performance of the device to drift, and can severely restrict the range of stable operation of some MEMS devices. In more severe instances, the trapped surface charges can cause stiction and device failure.

To prevent the build of an electric charge within the surfaces of the MEMS devices (e.g., the microphone 100 and accelerometer 200), some embodiments may have one or more charge elimination coatings on the moving structures (e.g., the diaphragm 101 and beam 201) and/or the stationary structure (e.g., the backplate 105/substrate 202). The charge elimination coating allows charge to dissipate quickly and/or resists the surface charge, thus avoiding an excessive build up in charge within the surfaces of the MEMS devices.

Figure 3:
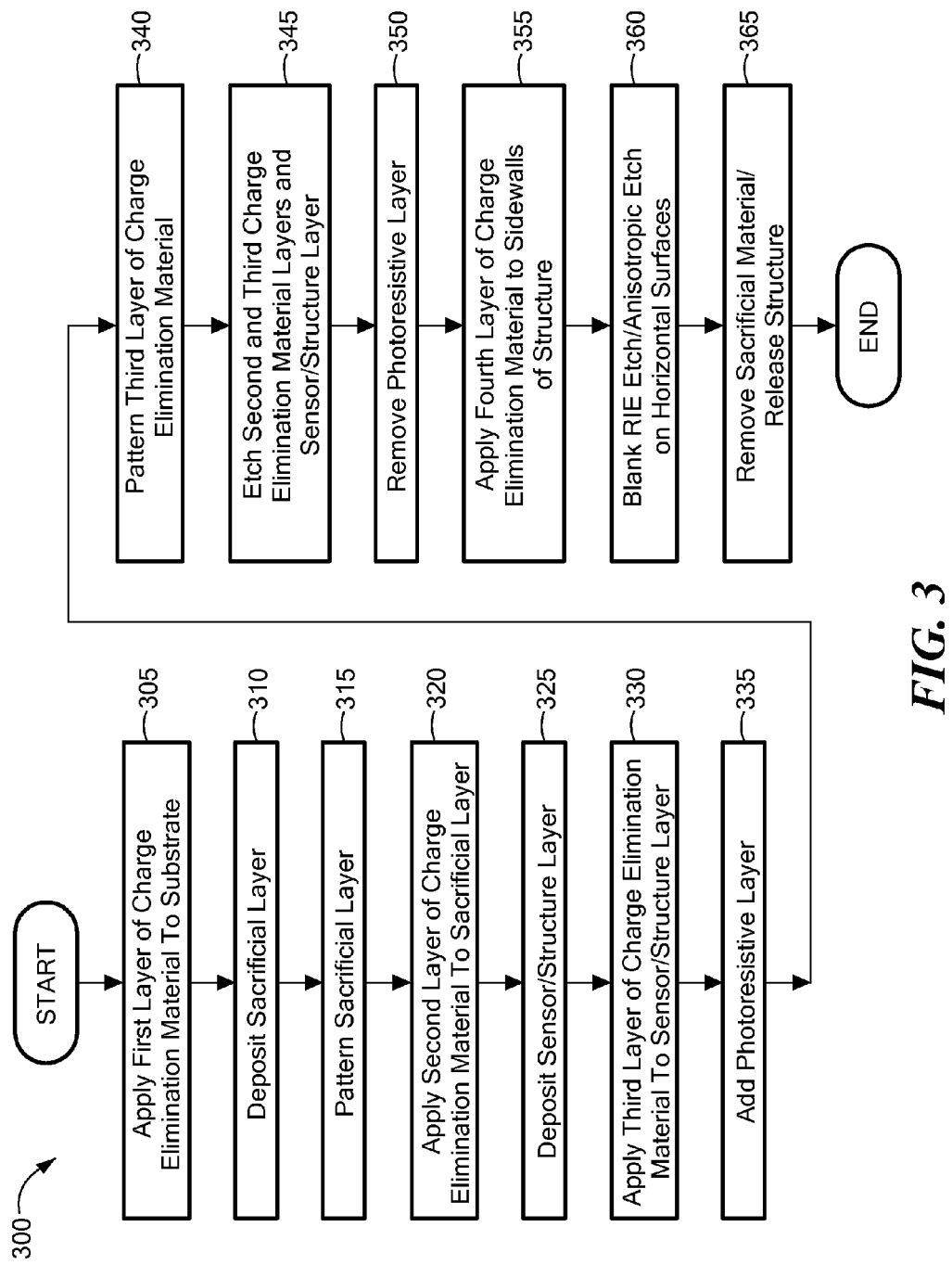
FIG. 3 shows a process of forming a MEMS device having improved charge elimination characteristics, in accordance with illustrative embodiments of the present invention.
Figure 4:
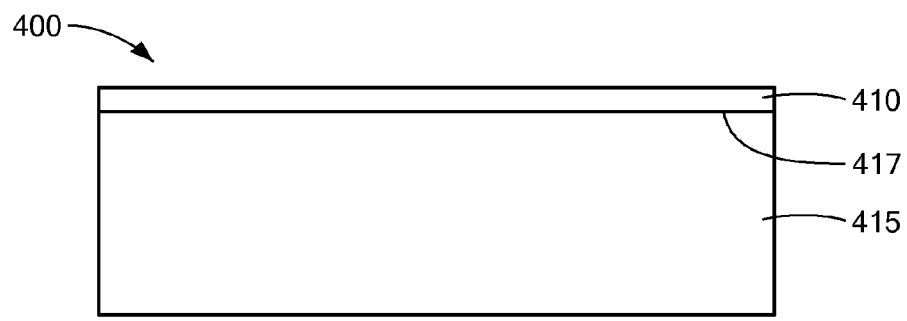
FIG. 4 schematically shows the MEMS device being formed in FIG. 3 during a stage of production (e.g., during Step 305 of FIG. 3) in accordance with embodiments of the present invention.

FIG. 3 shows a method for fabricating a MEMS device 400 with improved charge elimination characteristics, in accordance with one embodiment of the invention. FIGS. 4-10 illustrate this process by showing the intermediate stages of a MEMS device as it is fabricated. The process begins at step 405, in which a layer of charge elimination material 410 (FIG. 4) is deposited on the top surface 417 of a substrate 415. The substrate 415 may be part of a wafer, such as a bulk silicon wafer. The charge elimination material layer 410 can be deposited using a number of low-temperature deposition techniques. For example, the charge elimination material layer 410 can be deposited using plasma or vacuum based chemical or physical vapor deposition techniques, and liquid based sol-gel deposition techniques, to name but a few. It is important to note that it is preferable to use low temperature (less than 500° C.) deposition techniques to avoid damage to the substrate 415 and other structures/layers that will be formed to make up the MEMS device 400. However, some charge elimination materials (e.g., diamond) may require higher temperatures (e.g., approximately 900° C.).

Figure 5:
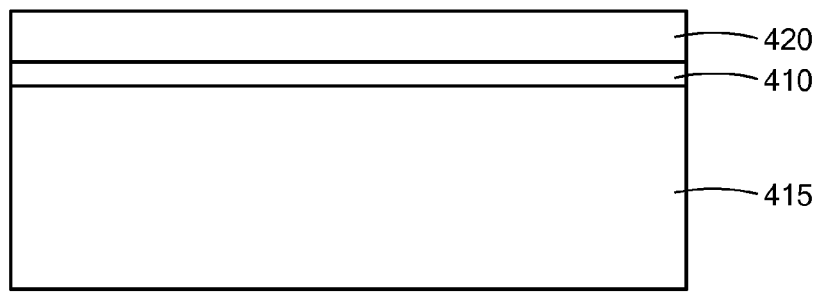
FIG. 5 schematically shows the MEMS device being formed in FIG. 3 during a stage of production (e.g., during Step 310 of FIG. 3), in accordance with embodiments of the present invention.

After the first charge elimination layer 410 is deposited onto the substrate 120, the method 300 may then deposit a sacrificial layer 420 onto the surface of the first charge elimination layer 410 (Step 310 and FIG. 5). This sacrificial layer 420 will fill in any gaps and any portions that may have been etched in a previous step (if any). Among other things, the sacrificial material layer 420 may be an oxide, germanium, plated metal, polyimide, or other organic material. After it is deposited, the method 300 begins patterning the sacrificial material layer 420 to act as a template for subsequently formed structures, such as anchors, contacts, and beams (step 315).

Figure 6:
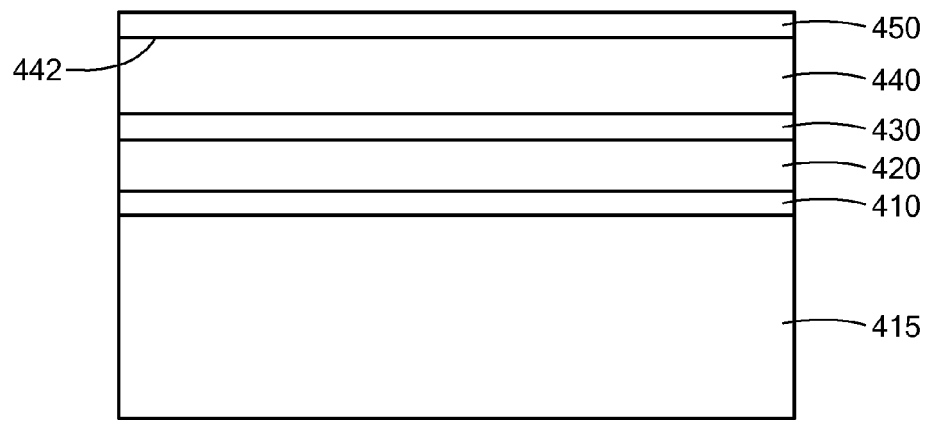
FIG. 6 schematically shows the MEMS device being formed in FIG. 3 during a stage of production (e.g., during Steps 320, 325, and 330 of FIG. 3), in accordance with embodiments of the present invention.

The method 300 may then deposit a second layer of charge elimination material 430 onto the sacrificial layer 420 (Step 320, FIG. 6), deposit a sensor/structure layer 440 onto the second layer of charge elimination material 430 (Step 325, FIG. 6), and deposit a third layer of charge elimination material 450 on the top surface 442 of the sensor/structure layer 440 (Step 330, FIG. 6). In particular, at this stage of fabrication, the device includes the substrate 425, the first layer of charge elimination material 410, the patterned sacrificial layer 420, the second layer of charge elimination material 430, the sensor/structure layer 440, and the third layer of charge elimination material 450. As discussed in greater detail below, the sensor/structure layer 440 will ultimately be etched to form the various structures required for operation of the MEMS device (e.g., the movable mass/electrode, diaphragm, etc.).

Prior to etching the sensor/structure layer, some embodiments may add a mask to aid in the subsequent patterning/etching of the layers described above. For example, the method 300 may add a layer of photoresitive material 460 (e.g., a metal or silicon oxide) (Step 335, FIG. 7) to the top surface of the third layer of charge elimination material 450. As the name suggests, the photoresistive material resists patterning (e.g., via photo lithography) and/or etching. Therefore, in order to allow subsequent etching of the appropriate areas, it is preferable that the photoresistive material 460 be added only to areas that should not be etched. For example, the photoresistive material 460 may be added to area above where the sensing structure 445 will be located (e.g., to avoid the etching and removal of the material that will ultimately form the sensing structure 445).

Figure 7:
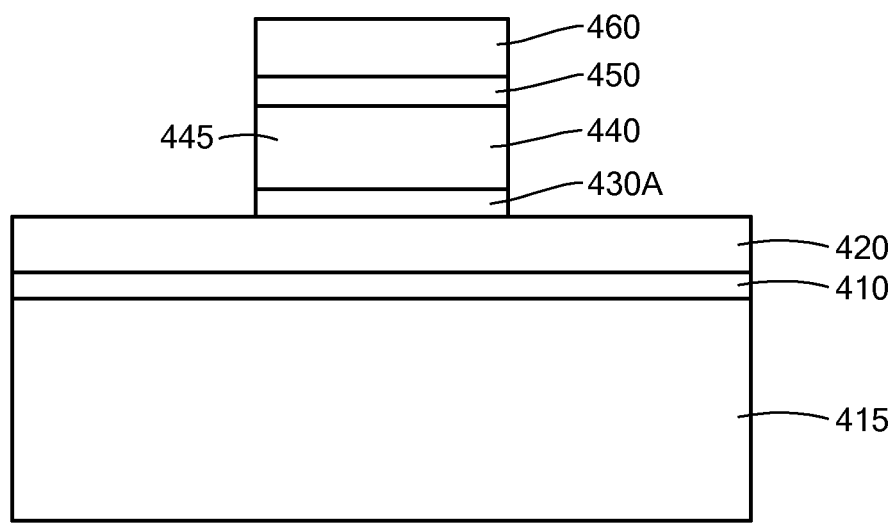
FIG. 7 schematically shows the MEMS device being formed in FIG. 3 during a stage of production (e.g., during Step 335 of FIG. 3), in accordance with embodiments of the present invention.

After the photoresistive material 460 is added, the method 300 may then (1) pattern the third layer of charge elimination material 450 using, for example, photo lithography (Step 340), and (2) etch the third layer of charge elimination material 450, the sensor/structure layer 440, and the second layer of charge elimination material 430 (Step 345). As shown in FIG. 7, etching these layers forms the sensing structure 445 described above (e.g., the diaphragm 101 and/or beam 201) and, with the exception of the material 430A located directly beneath the sensing structure 445 (e.g., the material 430A that is on the bottom surface of the sensing structure 445), removes the second layer of charge elimination material 430 located on the sacrificial layer 420. The sacrificial layer 420 is then, once again, exposed.

Figure 8:
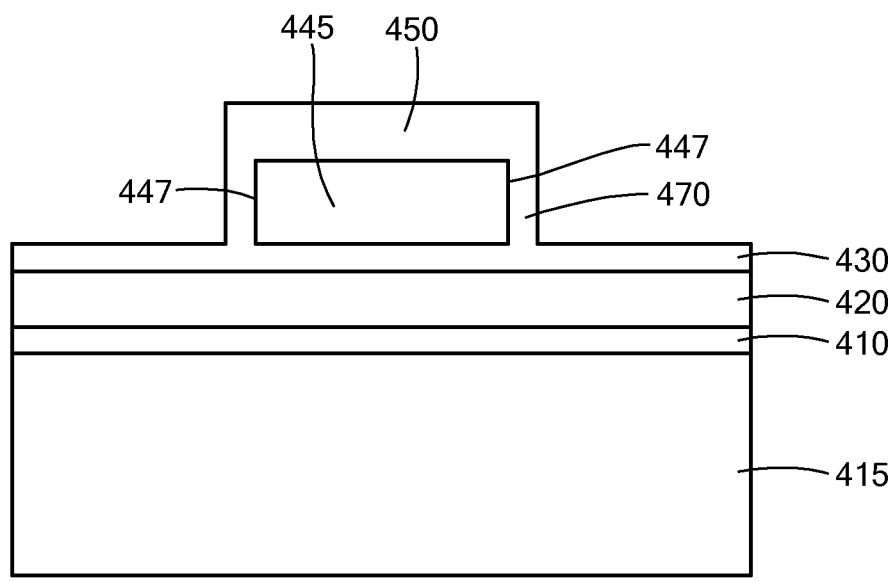
FIG. 8 schematically shows the MEMS device being formed in FIG. 3 during a stage of production (e.g., during Step 355 of FIG. 3), in accordance with embodiments of the present invention.
Figure 9:
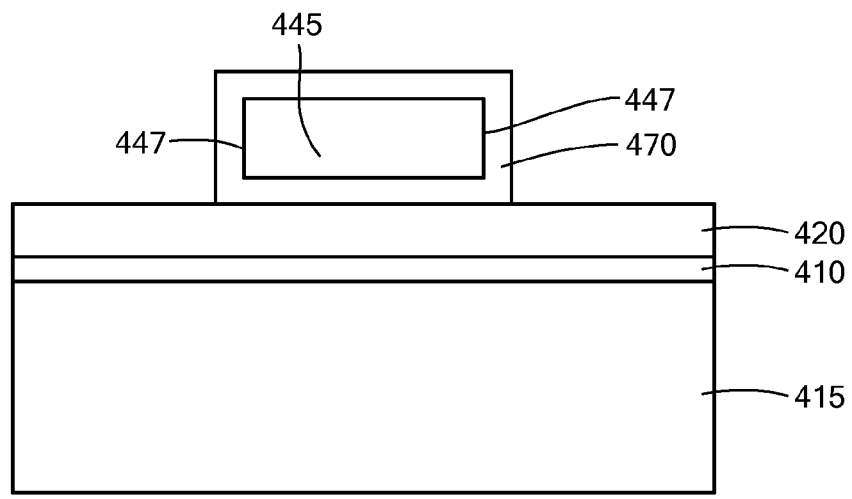
FIG. 9 schematically shows the MEMS device being formed in FIG. 3 during a stage of production (e.g., during Step 360 of FIG. 3), in accordance with embodiments of the present invention.

The method 300 may remove the photoresitive material layer 460 (Step 350) and add a fourth layer of the charge elimination material 470 (Step 355, FIG. 8). As shown in FIG. 8, this fourth layer of the charge elimination material 470 essentially increases the thickness of the charge elimination material 450 located on the sensing structure 445 (e.g., because it is added on top of the third layer of the charge elimination material 450), re-covers the layer of sacrificial material 420, and covers the sidewalls 447 of the sensing structure 445 (e.g., such that the sensing structure 445 is coated with charge elimination material on all sides). The method 300 may then, once again, perform an etching step to remove select portions of the fourth layer of charge elimination material 470 (Step 360, FIG. 9). For example, the method 300 may perform a blank etch (e.g., without a mask material such as the photo resistive layer described above), to remove the portions of the fourth charge elimination material layer 470 located above the sensing structure (e.g., on top of the third charge elimination material layer 450) and on the sacrificial layer 420.

It should be noted that it is preferable to utilize a blank reactive-ion etching (RIE) and/or an anisotropic/directional etching process when etching the fourth layer of charge elimination material 470 to ensure that only the material on the horizontal surfaces is etched and the material on the vertical sides of the sensing structure 445 remains. Additionally, it is important to stop the etching process once the sacrificial layer 420 is exposed. Therefore, to that end, the etch time and depth should be controlled and monitored to ensure that only the charge elimination material 470 is removed. For example, some embodiments of the method 300 described above can utilize an etch stop sensor that stops the etching process when it detects the sacrificial layer 420.

Figure 10:
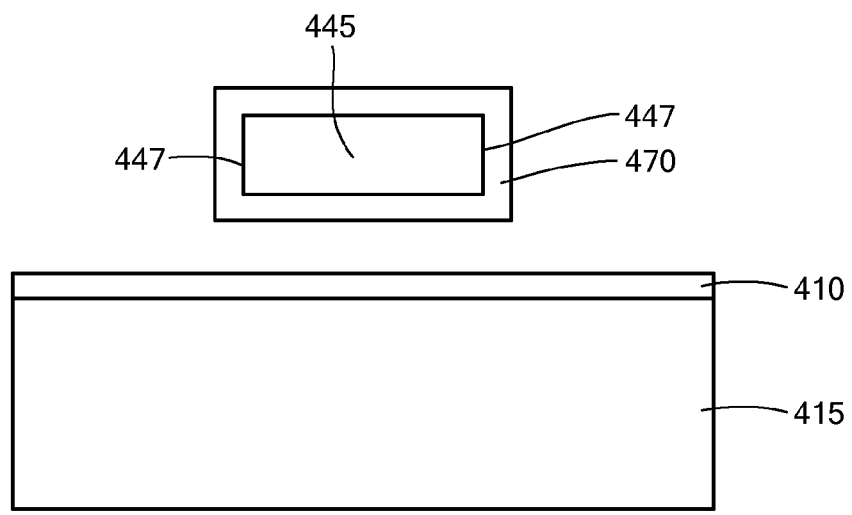
FIG. 10 schematically shows the MEMS device being formed in FIG. 3 during a stage of production (e.g., during Step 365 of FIG. 3), in accordance with embodiments of the present invention.

By etching and removing the fourth layer of charge elimination material from the horizontal surfaces, the method 300 may open a release hole (not shown) that may be used to remove the sacrificial material (Step 365) which, in turn, releases the sensing structure 445 to allow operation of the MEMS device 400. As shown in FIG. 10 and as discussed above, the MEMS device produced by the above described methodology will have a coating of charge elimination material on the sensing structure 445 (e.g., on all vertical and horizontal surfaces) and on the horizontal surface of the substrate 415.

As mentioned above, the charge elimination material helps to improve the reliability and accuracy of the MEMS device 400 by limiting the amount of charge that builds up within the device. To that end, depending on the material selected, the charge elimination material can be highly conductive (e.g., has high electron mobility) such that any charge quickly bleeds away. By allowing the charge to quickly bleed away, the charge elimination material prevents the charge from building up and negatively impacting the performance of the MEMS device 400. Alternatively, some charge elimination materials (e.g., diamond) resist surface charging altogether, thus avoiding a build-up of surface charge.

A number of highly conductive and charge resistant materials can be used for the charge elimination material. However, preferred embodiments utilize carbon related materials (e.g., a carbon based material and/or a material containing carbon), for example, Titanium Carbide, Silicon Carbide, diamond-like-carbon, diamond, graphene, graphite, carbon nanotube clusters, and amorphous carbon, to name but a few. Additionally, it should be noted that a different charge elimination material can used for each layer. For example, the first layer of charge elimination material can be titanium carbide, and one or more of the other layers can be a different material (e.g., silicon carbine, graphene, etc.). The thickness of the applied charge elimination material can vary depending on the application and the material selected. However, in some embodiments, each layer of the charge elimination material can range from 10 nanometers to 2 microns.

In some embodiments, the charge elimination material may have high etch selectivity that helps to prevent it from being unintentionally removed during the etching process. For example, the first charge elimination layer 410 can be diamond, silicon carbide, titanium carbide or other material that has high etch selectivity and resistance to etching. Therefore, when the sacrificial material is being etched/removed, there is a reduced risk of etching the first charge elimination layer 410 located on the substrate 415.

The method described above adds the charge elimination material to all surfaces of the sensing structure (e.g., both horizontal and vertical surfaces) and the substrate. However, other embodiments of the present invention may only add the charge elimination to some of the surfaces and/or only partially cover the surfaces. For example, some embodiments may only apply the charge elimination material to the horizontal surfaces of the sensing structure 445 (e.g., just the top bottom surface, just the top surface, or both the top and bottom surfaces of the sensing structure 445) and to the substrate 415, but not the vertical surfaces of the sensing structure 445. Additionally or alternatively, the method may only add the charge elimination material to the surface of the substrate 415 just below the sensing structure 445 (e.g., the charge elimination material thus is not located under the sensing structure 120 can be removed during one or more of the etching steps). Similarly, in some embodiments, only a portion of the horizontal and/or vertical surfaces of the sensing structure are covered with charge elimination material.

It is important to note that, although the above described embodiments relate to capacitively coupled MEMS devices (e.g., microphones, accelerometers, etc.), other embodiments can relate to other types of MEMS devices. For example, the methodology described above can be used to apply charge elimination material to piezoelectric and/or resistively coupled MEMS devices.

Figure 11:
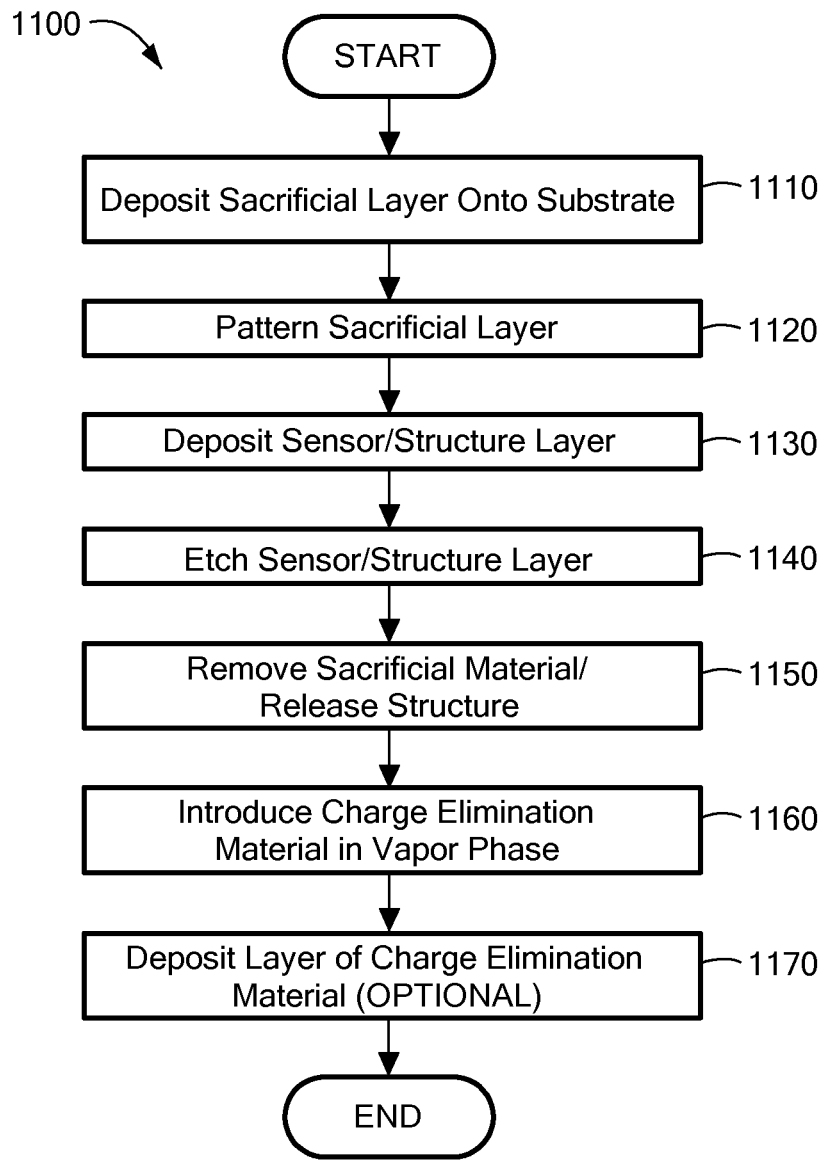
FIG. 11 shows an alternative process of forming a MEMS device having improved charge elimination characteristics, in accordance with illustrative embodiments of the present invention.

Although the above described methodology adds the charge elimination material before releasing the sensing structure 445 (e.g., as the individual layers of the MEMS devices are being added and as the MEMS device is being fabricated), other embodiments of the present invention can add the charge elimination material after releasing the sensing structure 445. For example, a method 1100 of adding the charge elimination material after fabrication and release of the MEMS device is shown FIG. 11.

In such embodiments, the method 1100 may first deposit a layer of sacrificial material on the top face of the substrate 415(Step 1110), and then pattern the sacrificial layer 420 for subsequent etching (Step 1120). After patterning the sacrificial layer 420, the method 1100 may then deposit the sensor/structure layer 440 onto the sacrificial layer 420 (Step 1130), and etch the sensor/structure layer 440 to form the sensing structure 447 (Step 1140). The method 1100 may then remove the sacrificial material layer 420 to release the sensing structure 447 (Step 1150). At this point, the basic MEMS structure is essentially fabricated.

To add the layers of charge elimination material and achieve the benefits described above (e.g., prevention of a surface charge build up), the method 1100 may introduce the charge elimination material coating by a chemical or physical vapor deposition process between the substrate 415 and the (released) sensor/structure layer 440 (Step 1160). For example, the charge elimination material may be introduced, in a vapor phase, via a hole/passage (not shown) through the sensor/structure layer 440 and/or via the space/gap between the substrate 415 and the sensor/structure layer 440. As the charge elimination material precursor is introduced, it will coat the top face/surface of the substrate 415 and the bottom surface of the sensing structure 447 (e.g., the exposed surfaces). Additionally, in some embodiments, the charge elimination material will also coat the side walls and the top surface of the sensing structure 447.

In some embodiments (e.g., those that introduce the charge elimination material using a physical vapor deposit), the charge elimination material may not coat the side walls, the bottom surface of the sensing structure, and the top surface of the substrate which is under the sensing structure 447. In that case, the method 100 may perform an additional and optional step to coat these surfaces. For example, the method 1100 may deposit a layer of charge elimination material on the sensor/structure layer 440 and the sensing structure 447 (Step 1170). This layer of charge elimination material may be deposited using the techniques mentioned above (e.g., plasma or vacuum based chemical or physical vapor deposition techniques, and liquid based sol-gel deposition techniques, etc.), and may cover the surfaces not covered by the physical vapor deposit (e.g., the side walls and bottom surface of the structure 447, and the top surface of the substrate 415 under the structure 447).

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method for producing a MEMS sensor device comprising: providing a substrate having one or more layers;
   forming a stationary structure on the substrate;
   applying a first charge elimination layer onto at least one portion of one given layer of the substrate;
   applying a sacrificial layer onto the first charge elimination layer;
   applying a second charge elimination layer onto at least a portion of the sacrificial layer;
   depositing a movable layer onto at least a portion of the second charge elimination layer;
   applying a third charge elimination layer onto at least a portion of the moveable layer;
   etching the movable layer to form a movable sensing structure, the movable sensing structure and stationary structure forming a MEMS sensor; and
   etching the sacrificial layer to release the structure, at least a portion of the second charge elimination layer located on a bottom surface of the structure, and at least a portion of the third charge elimination layer located on a top surface of the structure.

2. A method according to claim 1, further comprising: etching the third charge elimination layer, and the second charge elimination layer to remove at least a portion of the second and third charge elimination layers.

3. A method according to claim 2, further comprising depositing a photoresistance layer onto the third charge elimination layer prior to etching the third charge elimination layer, the photoresistance layer being resistant to etching and allowing selective etching of the third charge elimination layer, movable layer, and the second charge elimination layer to form the moveable sensing structure within the movable layer.

4. A method according to claim 3, further comprising removing the photoresistance layer.

5. A method according to claim 4, further comprising depositing a fourth charge elimination layer onto the MEMS sensor.

6. A method according to claim 5, wherein the fourth charge elimination layer covers a plurality of side surfaces of the movable sensing structure and at least a portion of the sacrificial layer.

7. A method according to claim 6, further comprising etching the fourth charge elimination layer to remove at least a portion of the fourth charge elimination layer covering the sacrificial layer.

8. A method according to claim 1, wherein the second charge elimination material covers the bottom surface of the movable sensing structure.

9. A method according to claim 1, wherein the first charge elimination layer is a carbon related layer.

10. A method according to claim 9, wherein the carbon related layer includes at least one of titanium carbide, silicon carbide, diamond-like-carbon, diamond, graphene, graphite, carbon nanotube clusters, and amorphous carbon.

11. The method according to claim 1 wherein the substrate comprises the stationary structure.

\* \* \* \* \*